(12) United States Patent
Iguchi

(10) Patent No.: US 9,666,838 B2
(45) Date of Patent: May 30, 2017

(54) ORGANIC ELECTROLUMINESCENT DEVICE AND MANUFACTURING METHOD THEREOF, AND DISPLAY DEVICE

(71) Applicant: BOE TECHNOLOGY GROUP CO., LTD., Beijing (CN)

(72) Inventor: Shinsuke Iguchi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,258

(22) PCT Filed: Dec. 1, 2014

(86) PCT No.: PCT/CN2014/092697
§ 371 (c)(1),
(2) Date: Aug. 20, 2015

(87) PCT Pub. No.: WO2016/029580
PCT Pub. Date: Mar. 3, 2016

(65) Prior Publication Data
US 2016/0064463 A1    Mar. 3, 2016

(30) Foreign Application Priority Data
Aug. 26, 2014    (CN) .......................... 2014 1 0426332

(51) Int. Cl.
*H01L 51/56* (2006.01)
*H01L 51/00* (2006.01)
*H01L 27/32* (2006.01)

(52) U.S. Cl.
CPC .......... *H01L 51/56* (2013.01); *H01L 27/3258* (2013.01); *H01L 51/0003* (2013.01); *H01L 51/0012* (2013.01)

(58) Field of Classification Search
CPC . H01L 51/56; H01L 51/5652; H01L 51/0012; H01L 51/0003; H01L 27/3258
See application file for complete search history.

(56) References Cited

U.S. PATENT DOCUMENTS

2004/0079937 A1    4/2004 Miyazawa
2004/0201048 A1   10/2004 Seki et al.
(Continued)

FOREIGN PATENT DOCUMENTS

CN    1446028 A    10/2003
CN    101027608 A    8/2007
(Continued)

OTHER PUBLICATIONS

First Chinese Office Action Appln. No. 201410426332.6; Dated Mar. 10, 2016.
(Continued)

*Primary Examiner* — Phuc Dang
(74) *Attorney, Agent, or Firm* — Ladas & Parry LLP

(57) ABSTRACT

An organic electroluminescent device and its manufacturing method, and a display device are provided. The manufacturing method of the organic electroluminescent device includes: forming a first electrode on a predetermined region of an insulating base; conducting a surface treatment to an upper surface of the first electrode and an upper surface of the insulating base which is not covered by the first electrode, so that the upper surface of the first electrode is lyophilic and the upper surface of the insulating base which is not covered by the first electrode is lyophobic; forming an electroluminescent layer on the first electrode; and forming a second electrode on the electroluminescent layer. In the organic electroluminescent device formed by the manufacturing method, the electroluminescent layer has a relatively uniform thickness.

18 Claims, 9 Drawing Sheets

(56) References Cited

U.S. PATENT DOCUMENTS

| | | | |
|---|---|---|---|
| 2005/0153114 A1* | 7/2005 | Gupta | H01L 51/0004 428/201 |
| 2007/0264590 A1 | 11/2007 | Fukuchi | |
| 2008/0231169 A1* | 9/2008 | Hata | H01B 1/10 313/500 |
| 2009/0194154 A1* | 8/2009 | Takahashi | H01L 27/14621 136/255 |
| 2009/0223560 A1* | 9/2009 | Kim | H01L 31/02168 136/256 |
| 2010/0227477 A1* | 9/2010 | Ito | H01L 51/0003 438/694 |
| 2011/0001423 A1* | 1/2011 | Natori | H01L 51/5206 313/504 |
| 2012/0229724 A1* | 9/2012 | Miyairi | C09K 19/0275 349/43 |
| 2013/0075708 A1* | 3/2013 | Kurihara | H01L 51/5209 257/40 |
| 2013/0087827 A1* | 4/2013 | Wang He | H01L 51/5293 257/100 |

FOREIGN PATENT DOCUMENTS

| | | |
|---|---|---|
| CN | 101785363 A | 7/2010 |
| JP | 2000-353594 A | 12/2000 |
| JP | 2000-2015866 A | 1/2002 |
| JP | 2000-4055177 A | 2/2004 |
| JP | 2009-048980 A | 3/2009 |

OTHER PUBLICATIONS

International Search Report & Written Opinion of the International Searching Authority Appln. No. PCT/CN2014/092697; Dated May 15, 2015.

* cited by examiner

ORGANIC ELECTROLUMINESCENT DEVICE AND MANUFACTURING METHOD THEREOF, AND DISPLAY DEVICE

TECHNICAL FIELD

Embodiments of the present invention relate to an organic electroluminescent device, its manufacturing method and a display device.

BACKGROUND

During recent years, when an electroluminescent device is formed in a display device, electroluminescent materials of different colors need to be coated, and coating the electroluminescent materials by an ink-jet method is the most efficient and the pattern so formed is the most accurate.

When the ink-jet method is adopted to coat the electroluminescent material, in order to define a coating region and prevent the electroluminescent material solution from flowing into adjacent pixels, a bank structure needs to be formed on the display device. FIG. 1 is a schematic diagram of the cross section of the electroluminescent material solution formed in the bank structure through the ink-jet method in the prior art; and FIG. 2 is a structural schematic view of the bank structure and a first electrode. As illustrated in FIGS. 1 and 2, the bank structure 4 is formed on a base substrate 1 and a thin film transistor 2, the bank structure 4 defines an ink-jet region 16, and a first electrode 3 is formed in the ink-jet region 16. In the prior art, the ink-jet method is adopted to drip an electroluminescent material solution 5 on the first electrode 3, the electroluminescent material solution 5 gathers within the ink-jet region 16, and then, a drier is used to dry the electroluminescent material solution 5 within the ink-jet region 16, thus an electroluminescent layer is formed on the first electrode 3.

FIG. 3a is a schematic diagram of the cross section of the electroluminescent layer formed through drying treatment when the inner side of the bank structure is lyophilic, and FIG. 3b is a schematic diagram of the cross section of the electroluminescent layer formed through drying treatment when the inner side of the bank structure is lyophobic. As illustrated in FIGS. 3a and 3b, during drying treatment, if the inner side of the bank structure 4 is lyophilic, a portion of the electroluminescent material solution 5 is adhered to the inner wall of the bank structure 4, so that the peripheral region of the finally formed electroluminescent layer 6 has a relative large thickness, while the thickness of the middle region is relative small, i.e., the electroluminescent layer 6 presents a "depressed" shape. If the inner side of the bank structure 4 is lyophobic, the electroluminescent material solution 5 will gather at the middle portion so that the peripheral region of the finally formed electroluminescent layer 6 has a relative small thickness while the middle region has a relative large thickness, i.e., the electroluminescent layer 6 presents a "protrusion" shape. Thus, the film thickness of the finally formed electroluminescent layer is uneven no matter the inner side of the bank structure is lyophilic or lyophobic, while the electroluminescent layer with the uneven thickness easily causes color loss or color unevenness when emitting light, thus the performance of the electroluminescent device is affected.

SUMMARY

Some embodiments of the present invention provide a manufacturing method of an organic electroluminescent device, and the manufacturing method of the organic electroluminescent device comprising:

forming a first electrode on a predetermined region of an insulating base;

conducting a surface treatment to an upper surface of the first electrode and an upper surface of the insulating base which is not covered by the first electrode, so that the upper surface of the first electrode is lyophilic, and the upper surface of the insulating base which is not covered by the first electrode is lyophobic;

forming an electroluminescent layer on the first electrode; and forming a second electrode on the electroluminescent device.

In one example, the step of forming the electroluminescent device on the first electrode comprises:

forming an electroluminescent material solution on the first electrode by an ink-jet method; and conducting a drying treatment to the electroluminescent material solution to form the electroluminescent layer.

In one example, the surface treatment is a plasma treatment.

In one example, the process condition of the plasma treatment is as follow:

a reaction pressure is a normal pressure, and a reaction gas is carbon tetrafluoride.

In one example, the contact angle of the electroluminescent material solution and the first electrode is smaller than or equivalent to 40°.

In one example, the insulating base has a thickness d in the range of 2 μm≤d≤10 μm.

In one example, the area ratio p of the area of the upper surface of the insulating base to the area of the predetermined region has a range of 1.0<p≤3.0.

In one example, the area ratio p has a range of 1.2≤p≤2.0.

In one example, the cross-section of the insulating base along the thickness direction has an inverted trapezoid shape.

In one example, the material of the insulating base is polyimide.

In one example, prior to the step of forming the first electrode on the insulating base, the method further comprises:

forming a thin film transistor on the base substrate;

forming the insulating base on the base substrate and the thin film transistor, the insulating base being formed with a via hole therein at a position corresponding to a drain electrode of the thin film transistor, wherein, the step of forming the first electrode on the insulating base comprises:

forming the first electrode on the upper surface of the insulating base and in the via hole, and the first electrode being electrically connected to the drain electrode via the via hole.

In one example, the step of forming the insulating base on the base substrate and the thin film transistor comprises:

forming an insulating base material on the insulating base and the thin film transistor; and conducting a patterning process to the insulating base material to form the insulating base and the via hole.

Some embodiments of the present invention provide an organic electroluminescent device, and the organic electroluminescent device comprises:

an insulating base;

a first electrode formed on a predetermined region of the insulating base, wherein an upper surface of the first electrode is lyophilic, and an upper surface of the insulating base which is not covered by the first electrode is lyophobic;

an electroluminescent layer formed on the first electrode; and a second electrode formed on the electroluminescent layer.

In one example, the organic electroluminescent device further comprises: a thin film transistor formed on a base substrate;

wherein, the insulating base is formed on the base substrate and the thin film transistor and a via hole is formed in the insulating base at a position corresponding to the drain electrode of the thin film transistor.

In some examples, the upper surface of the insulating base is a plane.

In some examples, the insulating base has a thickness d in a range of 2 μm≤d≤10 μm.

In some examples, the area ratio p of the area of the upper surface of the insulating base to the area of the predetermined region has a range of 1.0<p≤3.0.

In some examples, the area ratio p has a range of 1.2≤p≤2.0.

In some examples, the cross-section of the insulating base along the thickness direction has an inverted trapezoidal shape.

In some examples, the material of the insulating base is polyimide.

In some examples, the organic electroluminescent device further comprises: a hole injection layer and an electron injection layer, and the hole injection layer is formed between the first electrode and the electroluminescent layer, and the electron injection layer is formed between the second electrode and the electroluminescent layer.

In one example, the organic electroluminescent device further comprises: an electron blocking layer and a hole blocking layer, and the electron blocking layer is formed between the hole injection layer and the electroluminescent layer, and the hole blocking layer is formed between the electron injection layer and the electroluminescent layer.

Some embodiments of the present invention further provide a display device, comprising: an organic electroluminescent device, and the organic electroluminescent device adopts the on organic electroluminescent device.

Some embodiments of the present invention provide an organic electroluminescent device and its manufacturing method, and a display device, wherein the manufacturing method of the organic electroluminescent device comprise: forming a first electrode on the predetermined region of the insulating base; conducting surface treatment to the upper surface of the first electrode and the upper surface of the insulating base which is not covered by the first electrode, so that the upper surface of the first electrode is lyophilic, and the upper surface of the insulating base which is not covered by the first electrode is lyophobic; forming an electroluminescent layer on the first electrode; and forming a second electrode on the electroluminescent device. In the organic electroluminescent device formed by the on method, the electroluminescent device has a uniform thickness, so that the organic electroluminescent device can generate light with uniform color, and the performance of the organic electroluminescent device is improved. When the display device is disposed with the organic electroluminescent device, the display effect of the display device is effectively improved.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

Figure 1:
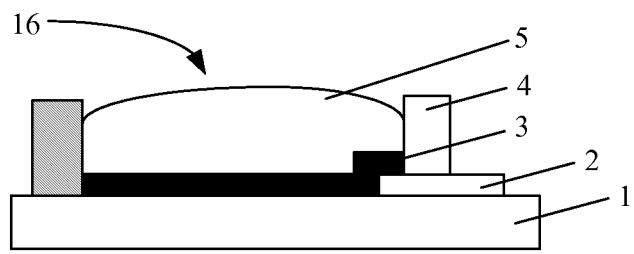
FIG. 1 is a schematic diagram of a cross section of an electroluminescent material solution formed in a bank structure in the prior art through the ink-jet method.
Figure 2:
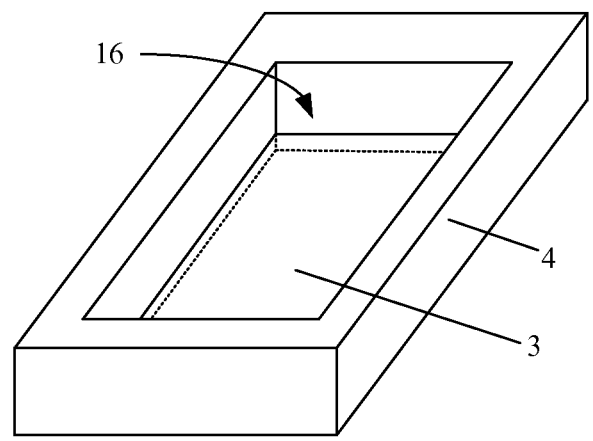
FIG. 2 is a structural schematic view of the bank structure and the first electrode.
Figure 3A:
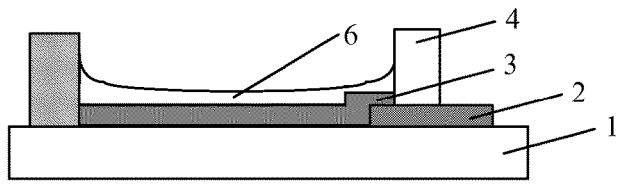
FIG. 3a is a schematic diagram of a cross section of the electroluminescent layer formed through drying treatment when the inner side of the bank structure is lyophilic.
Figure 3B:
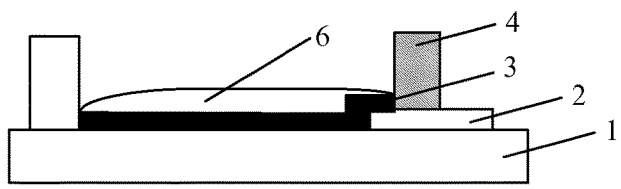
FIG. 3b is a schematic diagram of a cross section of the electroluminescent layer formed through drying treatment when the inner side of the bank structure is lyophobic.
Figure 4:
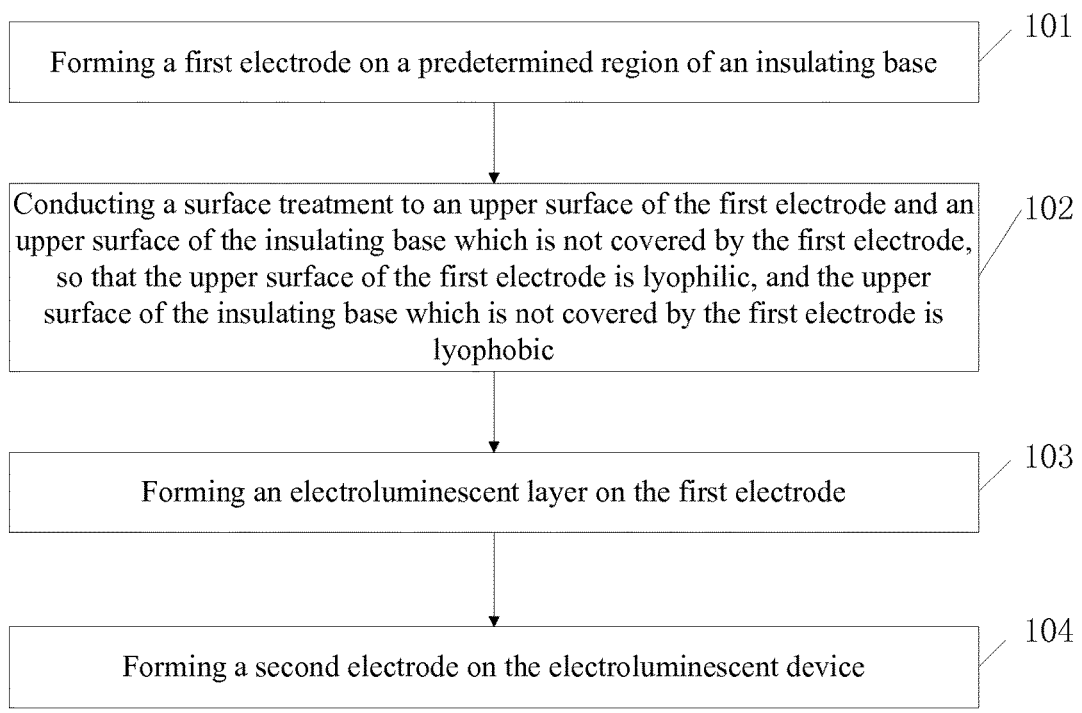
FIG. 4 is a flow chart of a manufacturing method of an organic electroluminescent deice provided by a first embodiment of the present invention.
Figure 5A:
FIG. 5a is a schematic diagram of a cross section of a first electrode formed on the predetermined region of an insulating base in first embodiment.
Figure 5B:
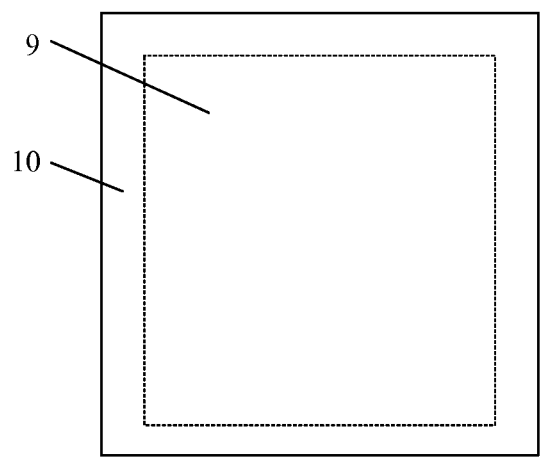
FIG. 5b is a top view of the insulating substrate in the first embodiment.

FIG. 4 is a flow chart of a manufacturing method of an organic electroluminescent deice provided by the first embodiment of the present invention. As illustrated in FIG. 4, it is taken as an example that a first electrode is an anode of the organic electroluminescent device and a second electrode is a cathode of the organic electroluminescent device, the manufacturing method comprises:

step 101: forming a first electrode on a predetermined region of an insulating base;

FIG. 5a is a schematic diagram of the cross section of the first electrode formed on the predetermined region 9 of the insulating base in the first embodiment; FIG. 5b a top view of the insulating substrate in the first embodiment. As illustrated in FIGS. 5a and 5b, the upper surface of the insulating base 7 is a plane, a layer of indium tin oxide (ITO) film is formed on the insulating base 7 by a plating technology, and the ITO film layer is patterned using patterning process to form the first electrode 3.

It should be explained that the predetermined region 9 does not contact the edge of the upper surface of the insulating base 7, and the area ratio p of the area of the upper surface of the insulating substrate 7 to the area of the predetermined region 9 (area of the upper surface of the first electrode 3) has a range of $1.0 < p \leq 3.0$. In some embodiments, the range of the area ratio p is $1.2 \leq p \leq 2.0$. The setting of the range of the area ratio p will be described in details in the following.

In addition, the patterning process in the present application indicates that it at least comprises processes such as photoresist coating, exposing, developing, etching, photoresist stripping.

Step 102: conducting a surface treatment to the upper surface of the first electrode and the upper surface of the insulating base which is not covered by the first electrode, so that the upper surface of the first electrode is lyophilic, and the upper surface of the insulating base which is not covered by the first electrode is lyophobic.

In step 102, through conducting the surface treatment to the upper surface (corresponding to the predetermined region 9) of the first electrode 3 and the upper surface (corresponding to a region other than the predetermined region 10) of the insulating base 7 which is not covered by the first electrode 3, the upper surface of the first electrode subjected to the surface treatment is lyophilic, and the upper surface of the insulating base 7 which is not covered by the first electrode 3 is lyophobic.

For example, the surface treatment is a plasma treatment, the reaction pressure during conducting the plasma treatment is a normal pressure, and the reaction gas is carbon tetrafluoride (chemical formula $CF_4$). During the plasma treatment, the lyophilic degree of the upper surface of the first electrode 3 and the lyophobic degree of the upper surface of the insulating base 7 which is not covered by the first electrode 3 can be controlled by adjusting factors such as the processing time, the reaction gas, the gas flow rate.

Step 103: forming an electroluminescent layer on the first electrode.

Step 103 for example, comprises:

Step 1031: forming an electroluminescent material solution on the first electrode by an ink-jet method.

Figure 6:
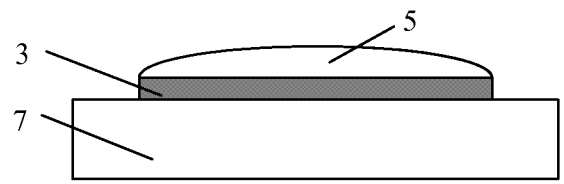
FIG. 6 is a schematic diagram of a cross section of the electroluminescent material solution formed on the first electrode in the first embodiment.

FIG. 6 is a schematic diagram of a cross section of the electroluminescent material solution formed on the first electrode in the first embodiment. As illustrated in FIG. 6, in step 1031, the electroluminescent material solution 5 is formed on the first electrode 3 by the ink-jet method. As the upper surface of the first electrode 3 is lyophilic and the upper surface of the insulating base 7 which is not covered by the first electrode 3 is lyophobic, the electroluminescent material solution 5 can generate appropriate accumulation on the upper surface of the first electrode 3.

Step 1032: conducting a drying treatment to the electroluminescent material solution to form the electroluminescent layer.

Figure 7:
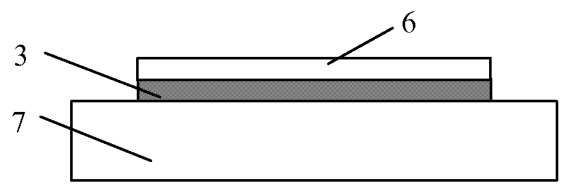
FIG. 7 is a schematic diagram of a cross section of the electroluminescent layer formed through conducting drying treatment to the electroluminescent material solution in the first embodiment.

FIG. 7 is a schematic diagram of a cross section of the electroluminescent layer formed by conducting a drying treatment to the electroluminescent material solution in the first embodiment. As illustrated in FIG. 7, drying treatment is conducted to the electroluminescent material solution 5 and then an electroluminescent layer 6 is formed on the first electrode 3. In the present embodiment, during conducting the drying treatment to the electroluminescent material solution 5, as the side surface of the electroluminescent material solution 5 does not contact any structure, the electroluminescent layer 6 formed after the drying process will not have the problems of "depression" or "protrusion" in the prior art. Thus, the formed electroluminescent layer has a uniform thickness.

Step 104: forming a second electrode on the electroluminescent layer.

Figure 8:
FIG. 8 is a schematic diagram of a cross section of a second electrode formed on the electroluminescent layer in the first embodiment.

FIG. 8 is a schematic diagram of a cross section of the second electrode formed on the electroluminescent layer in the first embodiment. As illustrated in FIG. 8, a layer of conductive film is formed on the electroluminescent layer 6 by a film forming technology, and then the conductive film is patterned by a patterning process to form a second electrode 11. The material of the conductive layer can be conductive materials such as silver, magnesium, alloy of magnesium and silver. Under the function of the first electrode 3 and the second electrode 11, for example, applying an appropriate voltage to the first electrode 3 and the second electrode 11, the electroluminescent layer 6 can emit light.

It should be explained that the case that the first electrode in the present embodiment is an anode and the second electrode is a cathode is only exemplary, and it is not intended to limit the technical solutions of the present application. In the present application, the first electrode can also be taken as the cathode and the second electrode can be taken as the anode, which will not be detailed herein.

Compared with the organic electroluminescent device in the prior art, the electroluminescent layer of the organic electroluminescent device in the first embodiment has a uniform thickness, thus, the organic electroluminescent device can generate light with uniform color, and then the performance of the organic electroluminescent device is improved.

Second Embodiment

Figure 9:
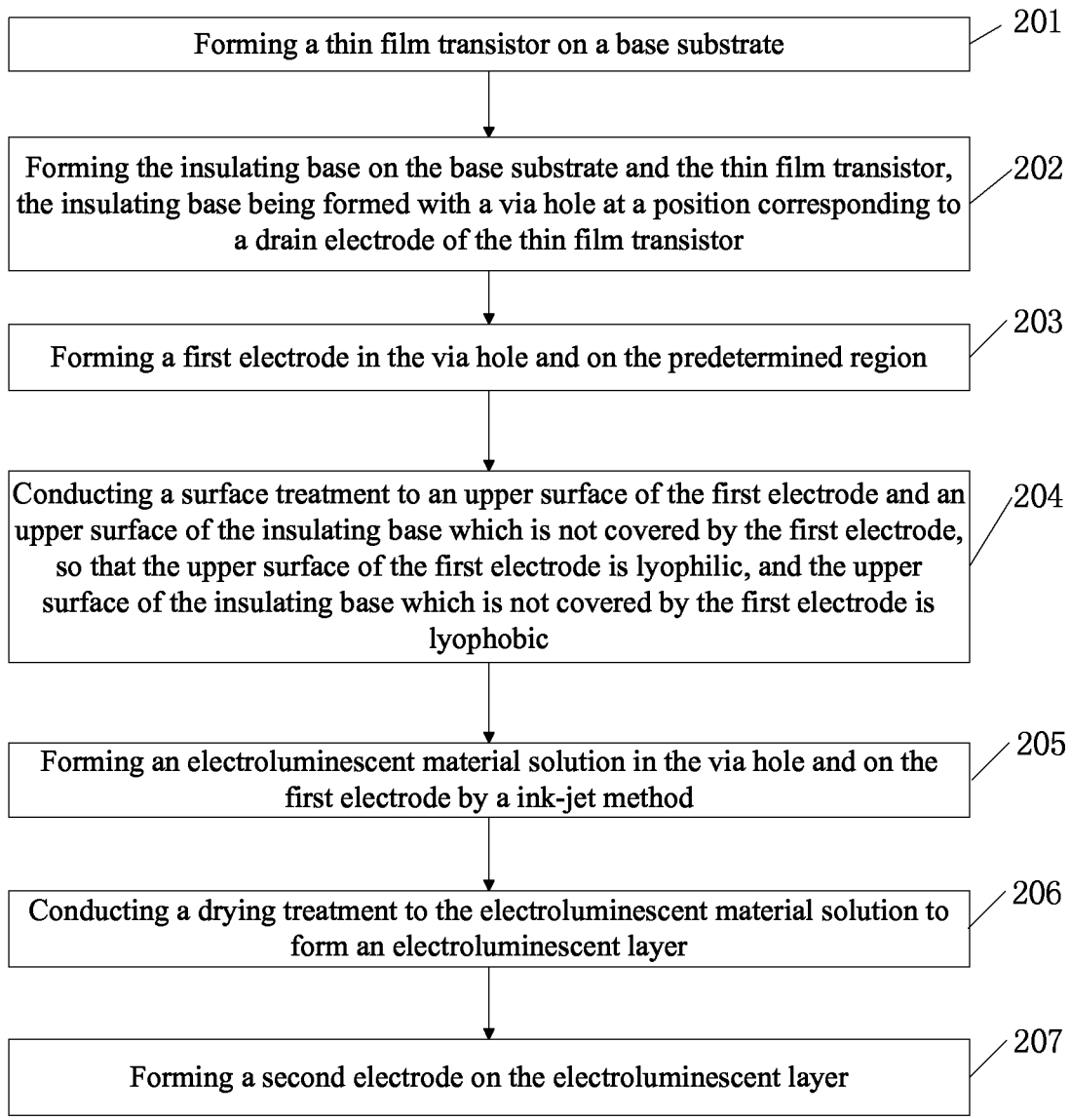
FIG. 9 is a flow chart of a manufacturing method of the organic electroluminescent device provided by a second embodiment of the present invention.

FIG. 9 is a flow chart of a manufacturing method of an organic electroluminescent device provided by the second embodiment of the present invention. As illustrated in FIG. 9, the manufacturing method comprises:

Step 201: forming a thin film transistor on the base substrate.

Figure 10:
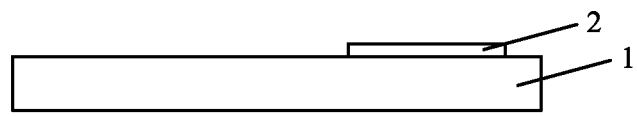
FIG. 10 is a schematic diagram of a cross section of a thin film transistor formed on a base substrate in the second embodiment.

FIG. 10 is a schematic diagram of a cross section of the thin film transistor formed on the base substrate in the second embodiment. As illustrated in FIG. 10, in step 201, a gate electrode pattern, an active layer pattern, a source electrode pattern and a drain electrode pattern are formed by a plurality of patterning processes, and thus the thin film transistor 2 is manufactured on the base substrate 1. The structure of the thin film transistor 2 can be any type of thin film transistor 2 in the prior art, and the thin film transistor 2 can be prepared through any production process of the thin film transistor in the prior art, and the specific production process will not be detailed herein.

Step 202: forming an insulating base on the base substrate and the thin film transistor, and forming a via hole in the insulating base at a position of corresponding to the thin film transistor.

Optionally, step 202 comprises:

Step 2021: forming an insulating base material on the base substrate 1 and the thin film transistor 2.

In step 2021, forming the insulating base material on the base substrate 1 and the thin film transistor 2. It is taken as an example that the insulating base material is polyimide, a polyimide film layer is formed on the base substrate and the thin film transistor by a coating process. Optionally, the polyimide has a thickness d ranging of 2 μm≤d≤10 μm.

It should be explained that the thickness of the insulating base material in the present embodiment can be adjusted correspondingly according to actual production needs.

Step 2022: conducting a patterning process to the insulating base material to form the insulating base and the via hole.

Figure 11:
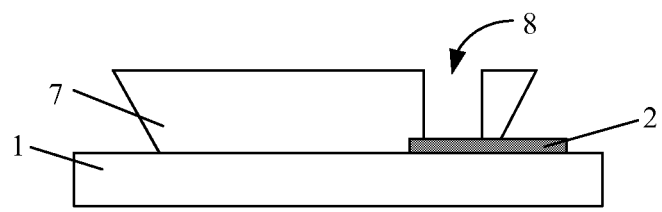
FIG. 11 is a schematic diagram of a cross section of an insulating base formed on the base substrate and the thin film transistor in the second embodiment.
Figure 12:
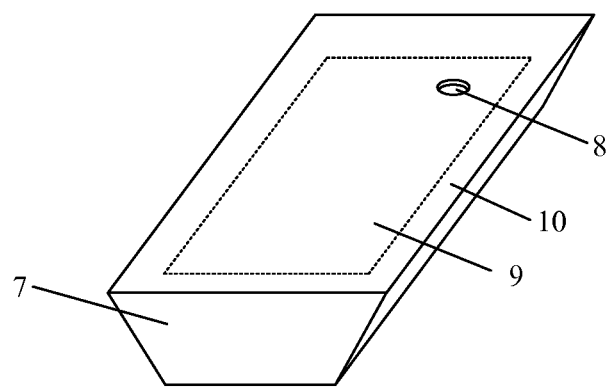
FIG. 12 is a structural schematic view of the insulating base in FIG. 11.

FIG. 11 is a schematic diagram of the cross section of the insulating base 7 formed on the base substrate and the thin film transistor in embodiment 2, and FIG. 12 is a structural view of the insulating base in FIG. 11. As illustrated in FIGS. 11 and 12, in step 2022, the polyimide film layer is patterned by a patterning process, thereby forming the insulating base 7 and the via hole 8. For example, the cross-section of the insulating base in the vertical direction, after being patterned, is in an inverted trapezoid shape, i.e., the area of the cross section of the insulating base 7 in the horizontal direction increases gradually from bottom up. For example, in the direction parallel to the base substrate surface, the insulating base 7 can be in a rectangular shape. The cross-section of the insulating base 7 which is perpendicular to the surface of the base substrate and perpendicular to one side of the above rectangle is in an inverted trapezoid shape. That is, the cross-section of the insulating base 7 along the thickness direction has an inverted trapezoid shape. The base side of the inverted trapezoid near the base substrate has a size smaller than that of the base side distal from the base substrate.

It should be explained that the insulating base 7 in FIG. 11 partially covers the thin film transistor 2, and the upper surface of the insulating base 7 comprises a predetermined region 9 and a peripheral region 10 surrounding the predetermined region 9.

Step 203: forming a first electrode on the predetermined region.

Figure 13:
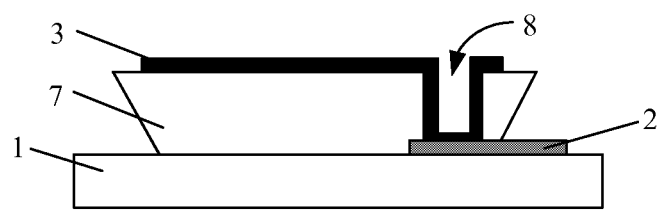
FIG. 13 is a schematic diagram of a cross section of a first electrode formed on the predetermined region of the insulating base and in a via hole in the second embodiment.
Figure 14:
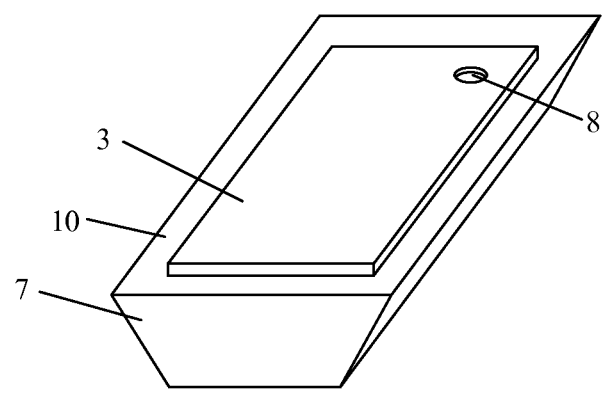
FIG. 14 is a structural schematic view of the insulating base and the first electrode in FIG. 13.

FIG. 13 is a schematic diagram of the cross section of the first electrode formed on the predetermined region of the insulating base and in the via hole in embodiment 2, and FIG. 14 is a structural view of the insulating base and the first electrode in FIG. 13. As illustrated in FIGS. 13 and 14, a layer of indium tin oxide (chemical formula ITO) film is formed in the via hole 8 and on the insulating base 7 by the plating technology, and the ITO film layer is patterned using a patterning process to form the first electrode 3. The first electrode 3 is located within the via hole 8 and on the predetermined region 9 of the insulating base 7.

It should be explained that the predetermined region 9 does not contact the edge of the upper surface of the insulating base 7, and the area ratio p of the area of the upper surface of the insulating base 7 and the area of the predetermined region 9 (area of the upper surface of the first electrode 3) has a range of $1.0<p\leq3.0$. In some embodiments, the range of the area ratio p is $1.2\leq p\leq2.0$. The setting of the range of the area ratio p will be described in details in the following.

Step 204: conducting a surface treatment to the upper surface of the first electrode and the upper surface of the insulating base which is not covered by the first electrode, so that the upper surface of the first electrode is lyophilic, and the upper surface of the insulating base which is not covered by the first electrode is lyophobic.

The process of the step 204 is identical with the process of the step 102 in the first embodiment, for the details, please refer to the description of step 102 in the above first embodiment, which is not described herein.

Step 205: forming an electroluminescent material solution in the via hole and on the first electrode by an ink-jet method.

Figure 15:
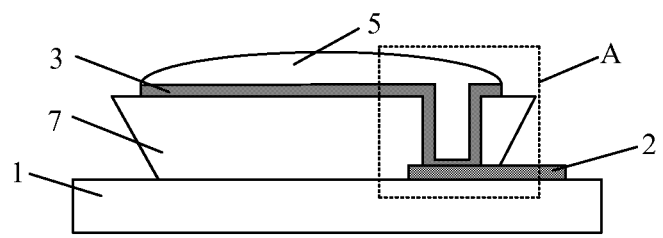
FIG. 15 is a schematic diagram of a cross section of an electroluminescent material solution formed in the via hole and on the first electrode by the ink-jet method in the second embodiment.
Figure 16:
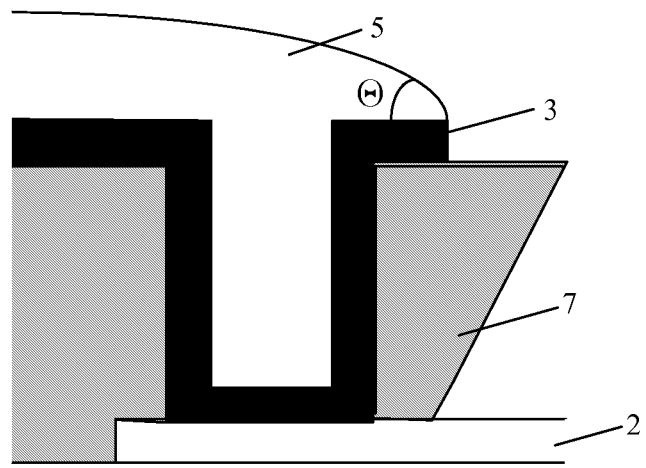
FIG. 16 is an amplification view of an structure A in FIG. 15.

FIG. 15 is a schematic diagram of a cross-section of the electroluminescent material solution formed within the via hole and on the first electrode by the ink-jet method in embodiment 2, and FIG. 16 is an amplification view of the structure A in FIG. 15. As illustrated in FIGS. 15 and 16, in step 205, the electroluminescent material solution 5 is formed within the via hole 8 and on the first electrode 3 by the ink-jet method. As the upper surface of the first electrode 3 is lyophilic and the upper surface of the insulating base 7 which is not covered by the first electrode 3 is lyophobic, the electroluminescent material solution 5 can generate appropriate accumulation on the upper surface of the first electrode 3. The contact angle between the electroluminescent material solution 5 and the first electrode 3 is θ. The contact angle θ between the electroluminescent material solution 5 and the first electrode 3 can be less than or equal to 40° by controlling the lyophilicity of the upper surface of the first electrode 3 and the lyophobicity of the upper surface of the insulating base 7 which is not covered by the first electrode 3.

In addition, as the upper surface of the first electrode 3 is lyophilic, the electroluminescent material solution 5 can have good invasion within the via hole, thereby preventing bubbles in the corners of the via hole 8. In addition, as the insulating base surrounding the first electrode 3 is lyophobic, the solution flow from the first electrode 3 to the peripheral insulating base is blocked.

Of course, the cross-section of the above insulating base 7 in the present embodiment is disposed to be an inverted trapezoid shape. If any droplets are dropped to the edge of the insulating base, as the gas-solid interface tension will be parallel to the side of the inverted trapezoid and then deflect toward the interior of the base, then in order to counteract the horizontal component of the solid-liquid interface tension and the gas-solid interface tension, the liquid-gas interface tension needs to deflect away from the base, thereby causing the increasing of the contact angle. Thus, even if the electroluminescent material solution 5 is dropped to the edge of the insulating base 7, overflow of the ink will be further prevented as the angle (contact angle) between the edge of the insulating base 7 and the organic electroluminescent material solution is over large.

The following is a detailed description to the setting of the range of the area ratio p. During setting the range of the area ratio p in step 103, considering that the periphery of the first electrode 3 needs to have a lyophobic surface, the area of the predetermined region 9 (the area of the upper surface of the first electrode 3) needs to be less than the area of the upper surface of the insulating base 7, and then the area ratio p of the area of the upper surface of the insulating base 7 to the area of the predetermined region 9 should be larger than 1. Meanwhile, in order to ensure the effective light emitting area (equal to the area of the predetermined region 9) of the electroluminescent device, the area of the predetermined region 9 cannot be too small, and as an optional solution of the present embodiment, the area of the predetermined region 9 at least occupies one third of the area of the upper surface of the entire insulating base 7, i.e., the area ratio p of the area of the upper surface of the insulating base 7 to the area of the predetermined region 9 is less than or equal to 3. Of course, as some embodiments of the present invention, the area ratio p has a range of $1.2 \le p \le 2.0$.

Step 206: conducting a drying treatment to the electroluminescent material solution to form the electroluminescent layer.

Figure 17:
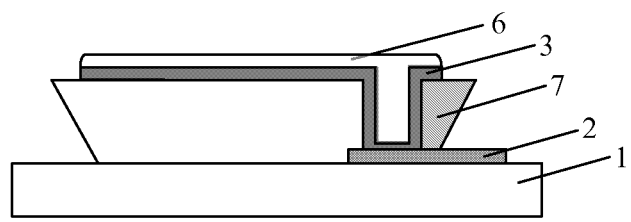
FIG. 17 is a schematic diagram of a cross section of the electroluminescent layer formed by conducting a drying treatment to the electroluminescent material solution in the second embodiment.

FIG. 17 is a schematic diagram of the cross-section of the electroluminescent layer formed by conducting the drying treatment to the electroluminescent material solution in the second embodiment. As illustrated in FIG. 17, the electroluminescent layer 6 is formed on the first electrode 3 by conducting a drying treatment to the electroluminescent material solution 5. In the present embodiment, during conducting the drying treatment to the electroluminescent material solution 5, as the side surface of the electroluminescent material solution 5 does not contact any structure, the electroluminescent layer 6 formed by the drying process will not have the problems of "depression" or "protrusion" in the prior art. It should be explained that the electroluminescent layer 6 formed in step 206 has a uniform thickness in the regions except the thickness in the via hole 8 which is relatively large, and when the electroluminescent layer 6 emits light, as the cross-section of the via hole 8 is much smaller than the area of the upper surface of the entire electroluminescent layer 6, the non-uniform light emission at the via hole will not affect the light emission effect of the entire electroluminescent layer 6, and then the surface of the electroluminescent layer 6 can also generate light with uniform color.

Step 207: forming a second electrode on the electroluminescent layer.

Figure 18:
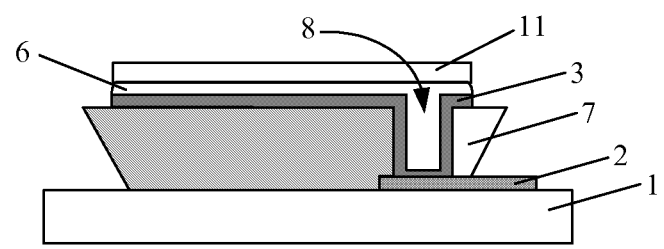
FIG. 18 is a schematic diagram of a cross section of a second electrode formed on the electroluminescent layer in the second embodiment.

FIG. 18 is a schematic diagram of a cross-section of the second electrode formed on the electroluminescent layer in embodiment 2. As illustrated in FIG. 18, a layer of conductive film is formed on the electroluminescent layer 6 by a plating technology, and then the conductive film is patterned by a patterning process to form a second electrode 11. The material of the conductive layer can be conductive materials such as silver, magnesium, alloy of magnesium and silver. Under the function of the first electrode 3 and the second electrode 11, the electroluminescent layer 6 can emit light.

It should be explained that the situation that the predetermined region 9 in FIG. 7 is in a rectangular shape will not limit technical solution of the present invention, and in the present invention, the predetermined region 9 can be other patterns, for example, circle, triangular, polygon and etc.

Compared with the organic electroluminescent device in the prior art, the electroluminescent layer of the organic electroluminescent device in the embodiment has a more uniform thickness, thus, the organic electroluminescent device can generate light with uniform color, and then the performance of the organic electroluminescent device is improved.

Third Embodiment

The third embodiment of the present invention provides an electroluminescent device, and referring to FIG. 8, the electroluminescent device comprises: an insulating base 7, a first electrode 3, an electroluminescent layer 6 and a second electrode 11. The upper surface of the insulating base is a plane, the first electrode is formed on the predetermined region of the insulating base, the upper surface of the first electrode is lyophilic, the upper surface of the insulating base which is not covered by the first electrode is lyophobic, the electroluminescent layer is formed on the first electrode and the second electrode is formed on the electroluminescent layer.

The electroluminescent device provided by the present embodiment can be manufactured by the manufacturing method of the electroluminescent device provided by the first embodiment, and for the specific process, please refer to the description in the above embodiment, which is not described herein anymore.

The third embodiment of the present invention provides an organic electroluminescent device in which the electroluminescent layer has a uniform thickness, thus, the organic electroluminescent device can generate light with uniform color, thereby improving the performance of the organic electroluminescent device.

Fourth Embodiment

The fourth embodiment of the present invention provides an organic electroluminescent device, and referring to FIG. 18, the organic electroluminescent device comprises: a base substrate 1, a thin film transistor 2, an insulating base 7, a first electrode 3, an electroluminescent layer 6 and a second electrode 11. The thin film transistor 2 is formed on the base substrate 1, the insulating base 7 is formed on the base substrate 1 and the thin film transistor 2, a via hole 8 is formed in the position of the insulating base 7 corresponding to the drain electrode of the thin film transistor 2, the first electrode is formed within the via hole 8 and on the predetermined region of the insulating base 7, the upper surface of the first electrode is lyophilic, and the upper surface of the insulating base which is not covered by the first electrode is lyophobic, the electroluminescent layer 6 is formed on the first electrode 3, and the second electrode 11 is formed on the electroluminescent layer 6.

Optionally, the ratio p of the area of the upper surface of the insulating base 7 to the area of the predetermined region has a range of $1.0 < p \le 3.0$. Further preferably, the range of the area ratio p is $1.2 \le p \le 2.0$.

Optionally, the cross-section of the insulating base 7 is an inverted trapezoid shape.

Optionally, the material of the insulating base 7 is polyimide.

Optionally, the insulating base 7 has a thickness d in a range of $2\ \mu m \le d \le 10\ \mu m$.

It should be explained that the electroluminescent device provided by the present embodiment can be manufactured by the manufacturing method of the organic electroluminescent device provided by the second embodiment, and for the specific process, please refer to the description in the above embodiment, which is not described herein anymore.

The fourth embodiment of the present invention provides an organic electroluminescent device in which the electroluminescent layer has a uniform thickness, thus, the organic electroluminescent device can generate light with uniform color, thereby improving the performance of the organic electroluminescent device.

Fifth Embodiment

Figure 19:
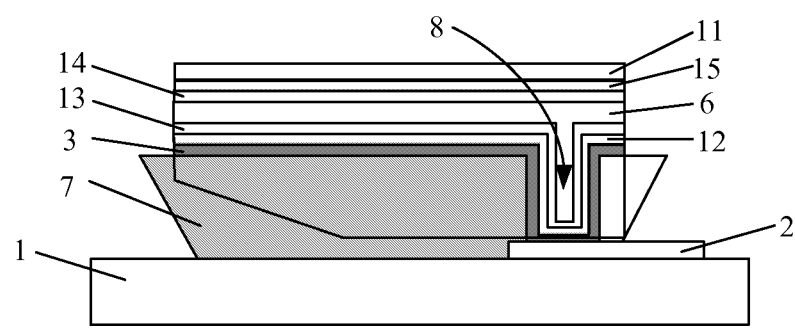
FIG. 19 is a schematic diagram of a cross section of an organic electroluminescent device provided in a fifth embodiment of the present invention.

FIG. 19 is a schematic diagram of a cross-section of an organic electroluminescent device provided in the fifth embodiment of the present invention. As illustrated in FIG. 19, the organic electroluminescent device comprises: a base substrate 1, a thin film transistor 2, an insulating base 7, a first electrode 3, an electroluminescent layer 6 and a second electrode 11, wherein the thin film transistor 2 is formed on the base substrate 1, the insulating base 7 is formed on the base substrate 1 and the thin film transistor 2, a via hole 8 is formed in the position of the insulating base 7 corresponding to the drain electrode of the thin film transistor 2, the first electrode is formed within the via hole 8 and on the predetermined region of the insulating base 7, the upper surface of the first electrode is lyophilic, and the upper surface of the insulating base 7 which is not covered by the first electrode 3 is lyophobic, the electroluminescent layer 6 is formed on the first electrode 3 and the second electrode 11 is formed on the electroluminescent layer 6. In the fifth embodiment of the present invention, the first electrode 3 is an anode of the electroluminescent device, and the second electrode 11 is a cathode of the electroluminescent device.

Optionally, the electroluminescent device further comprises: a hole injection layer 12 and an electron injection layer 15, the hole injection layer 12 is formed between the first electrode 3 and the electroluminescent layer 6, the electron injection layer 15 is formed between the second electrode 11 and the electroluminescent layer 6, the hole injection layer 12 is used to improve the amount of holes transferring from the first electrode 3 to the electroluminescent layer 6, and the electron injection layer 15 is used to improve the amount of the electrons transferring from the second electrode 11 to the electroluminescent layer 6. The amounts of the electrons and holes in the electroluminescent layer 6 can be effectively increased by disposing the hole injection layer 12 and the electron injection layer 15 in the present embodiment, thereby improving the combination ratio of the electrons to the holes and further improving the light emission efficiency of the electroluminescent layer 6.

Furthermore optionally, the electroluminescent device further comprises: an electron blocking layer 13 and a hole blocking layer 14, the electron blocking layer 13 is formed between the hole injection layer 12 and the electroluminescent layer 6, the hole blocking layer 14 is formed between the electron injection layer 15 and the electroluminescent layer 6, the electron blocking layer 13 is used to block transferring of electrons in the electroluminescent layer 6 to the first electrode 3, thereby ensuring the amount of the electrons in the electroluminescent layer 6; the hole blocking layer 14 is used to block the transferring of holes in the electroluminescent layer 6 to the second electrode 11, thereby ensuring the amount of the holes in the electroluminescent layer 6. The amounts of the electrons and the holes in the electroluminescent layer 6 can be increased effectively by disposing the electron blocking layer 13 and the hole blocking layer 14 in the present embodiment, thereby improving the combination ratio of the electrons to the holes and further improving the light emission efficiency of the electroluminescent layer.

The fifth embodiment of the present invention provides an organic electroluminescent device in which the electroluminescent layer has a uniform thickness, thus the organic electroluminescent layer can generate light with uniform color, thereby effectively improving the performance of the organic electroluminescent layer.

Sixth Embodiment

The sixth embodiment of the present invention provides a display device, the display device comprises the organic electroluminescent device, the organic electroluminescent device can adopt the organic electroluminescent device provided by any one of the above third embodiment to fifth embodiment, the display device can be a product or a part having a display function, such as a display panel, a mobile phone, a tablet computer, a TV, a display, a notebook computer, a digital photo frame and a navigator.

The sixth embodiment of the present invention provides a display device which comprises the electroluminescent device provided by the above third embodiment and/or fourth embodiment and/or fifth embodiment, and as the electroluminescent device can generate uniform light, the display device can display stable pixels, thereby improving the display effect of the display device.

Described above are just exemplary embodiments of the present invention, which are not intended to restrict the scope of protection of the present invention, and the scope of protection of the present invention shall be determined by the appended claims.

The present application claims the priority of the Chinese patent application No. 201410426332.6, filed on Aug. 26, 2014, and the disclosure of Chinese patent application is incorporated herein on its entirety as a part of the present application.

The invention claimed is:

1. A method of manufacturing an organic electroluminescent device, comprising:
    forming a first electrode on a predetermined region of an insulating base;
    conducting a surface treatment to an upper surface of the first electrode and an upper surface of the insulating base which is not covered by the first electrode, so that the upper surface of the first electrode is lyophilic, and the upper surface of the insulating base which is not covered by the first electrode is lyophobic;
    forming an electroluminescent layer on the first electrode; and
    forming a second electrode on the electroluminescent device,
    wherein prior to forming the first electrode on the insulating base, further comprising:
    forming a thin film transistor on a base substrate;
    forming the insulating base on the base substrate and the thin film transistor, the insulating base being formed with a via hole therein at a position corresponding to a drain electrode of the thin film transistor,
    wherein forming the first electrode on the insulating base comprises:
    forming the first electrode on the upper surface of the insulating base and in the via hole, and the first electrode being electrically connected to the drain electrode via the via hole, and
    wherein one of the first electrodes and the second electrode is an anode of the organic electroluminescent device, and the other one is a cathode of the organic electroluminescent device.

2. The method of manufacturing the organic electroluminescent device according to claim 1, wherein, forming the electroluminescent layer on the first electrode comprises:
    forming an electroluminescent material solution on the first electrode by an ink-jet method; and
    conducting a drying treatment to the electroluminescent material solution to form the electroluminescent layer.

3. The method of manufacturing the organic electroluminescent device according to claim 2, wherein, a contact angle between the electroluminescent material solution and the first electrode is less than or equivalent to 40°.

4. The method of manufacturing the organic electroluminescent device according to claim 1, wherein, the surface treatment is a plasma treatment.

5. The method of manufacturing the organic electroluminescent device according to claim 4, wherein, the plasma treatment has the following process condition:
a reaction pressure is a normal pressure, and a reaction gas is carbon tetrafluoride.

6. The method of manufacturing the organic electroluminescent device according to claim 1, wherein, a cross-section of the insulating base along a thickness direction has an inverted trapezoid shape.

7. The method of manufacturing the organic electroluminescent device according to claim 1, wherein, the insulating base has a material of polyimide.

8. The method of manufacturing the organic electroluminescent device according to claim 1, wherein, forming the insulating base on the base substrate and the thin film transistor comprises:
forming an insulating base material on the insulating base and the thin film transistor; and
conducting a patterning process to the insulating base material to form the insulating base and the via hole.

9. An organic electroluminescent device, comprising:
an insulating base;
a first electrode, formed on a predetermined region of the insulating base, wherein an upper surface of the first electrode is lyophilic and an upper surface of the insulating base which is not covered by the first electrode is lyophobic;
an electroluminescent layer, formed on the first electrode; and
a second electrode, formed on the electroluminescent layer,
the organic electroluminescent device further comprising:
a thin film transistor formed on the base substrate;
wherein, the insulating base is formed on the base substrate and the thin film transistor and a via hole is formed in the insulating base at a position corresponding to a drain electrode of the thin film transistor, and
wherein one of the first electrodes and the second electrode is an anode of the organic electroluminescent device, and the other one is a cathode of the organic electroluminescent device.

10. The organic electroluminescent device according to claim 9, wherein, the upper surface of the insulating base is a plane.

11. The organic electroluminescent device according to claim 9, wherein, the insulating base has a thickness d in a range of 2 µm≤d≤10 µm.

12. The organic electroluminescent device according to claim 9, wherein, an area ratio p of an area of the upper surface of the insulating base to an area of the predetermined region has a range of 1.0<p≤3.0.

13. The organic electroluminescent device according to claims 12, wherein, the area ratio p has a range of 1.2≤p≤2.0.

14. The organic electroluminescent device according to claim 9, wherein, a cross-section of the insulating base along a thickness direction has an inverted trapezoid shape.

15. The organic electroluminescent device according to claim 9, wherein, the insulating base has a material of polyimide.

16. The organic electroluminescent device according to claim 9, further comprising: a hole injection layer and an electron injection layer, and the hole injection layer is formed between the first electrode and the electroluminescent layer, and the electron injection layer is formed between the second electrode and the electroluminescent layer.

17. The organic electroluminescent device according to claim 16, further comprising: an electron blocking layer and a hole blocking layer, and the electron blocking layer is formed between the hole injection layer and the electroluminescent layer, and the hole blocking layer is formed between the electron injection layer and the electroluminescent layer.

18. A display device, comprising the organic electroluminescent device according to claim 9.

* * * * *